(12) United States Patent
Benson

(10) Patent No.: US 11,791,775 B2
(45) Date of Patent: Oct. 17, 2023

(54) THERMAL TEMPERATURE SENSORS FOR POWER AMPLIFIERS

(71) Applicant: Analog Devices, Inc., Wilmington, MA (US)

(72) Inventor: Keith E. Benson, Hopkinton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 17/652,462

(22) Filed: Feb. 24, 2022

(65) Prior Publication Data

US 2023/0006610 A1 Jan. 5, 2023

Related U.S. Application Data

(62) Division of application No. 16/684,179, filed on Nov. 14, 2019, now Pat. No. 11,264,954.

(51) Int. Cl.
*H03F 3/16* (2006.01)
*H03F 3/14* (2006.01)
(Continued)

(52) U.S. Cl.
CPC .............. *H03F 1/306* (2013.01); *G01K 7/16* (2013.01); *H03F 3/213* (2013.01);
(Continued)

(58) Field of Classification Search
CPC .... H03F 1/306; H03F 3/213; H03F 2200/165; H03F 2200/451; H03F 2200/468;
(Continued)

(56) References Cited

U.S. PATENT DOCUMENTS

| 5,724,004 A | 3/1998 | Reif et al. |
| 6,075,995 A | 6/2000 | Jensen |

(Continued)

FOREIGN PATENT DOCUMENTS

| CN | 102281623 B | 2/2014 |
| CN | 102281357 B | 7/2014 |

(Continued)

OTHER PUBLICATIONS

Cozette, Flavien, et al. "Temperature monitoring of short-gate length AlGaN/GaN HEMT via an integrated sensor." *2018 48th European Solid-State Device Research Conference (ESSDERC)*, pp. 134-137. IEEE, 2018.

(Continued)

*Primary Examiner* — Khanh V Nguyen
(74) *Attorney, Agent, or Firm* — Knobbe, Martens, Olson & Bear, LLP

(57) ABSTRACT

Thermal temperature sensors for power amplifiers are provided herein. In certain implementations, a semiconductor die includes a compound semiconductor substrate, and a power amplifier including a plurality of field-effect transistors (FETs) configured to amplify a radio frequency (RF) signal. The plurality of FETs are arranged on the compound semiconductor substrate as a transistor array. The semiconductor die further includes a semiconductor resistor configured to generate a signal indicative of a temperature of the transistor array. The semiconductor resistor is located adjacent to one end of the transistor array.

20 Claims, 12 Drawing Sheets

(51) Int. Cl.
H03F 1/30 (2006.01)
H03F 3/213 (2006.01)
G01K 7/16 (2006.01)

(52) U.S. Cl.
CPC .. *H03F 2200/165* (2013.01); *H03F 2200/451* (2013.01); *H03F 2200/468* (2013.01)

(58) Field of Classification Search
CPC .. H03F 3/1935; H03F 3/193; H03F 2200/372; H03F 3/16; H03F 3/195; H03F 3/14; G01K 7/16; H01L 2924/3011; H01L 23/66
USPC .................................................. 330/277, 307
See application file for complete search history.

(56) References Cited

U.S. PATENT DOCUMENTS

| | | | |
|---|---|---|---|
| 6,194,968 B1 * | 2/2001 | Winslow | H03F 3/195 |
| | | | 330/285 |
| 6,215,358 B1 | 4/2001 | Hon et al. | |
| 6,332,710 B1 | 12/2001 | Aslan et al. | |
| 6,683,499 B2 | 1/2004 | Lautzenhiser et al. | |
| 6,731,171 B2 | 5/2004 | Yamashita | |
| 6,759,891 B2 | 7/2004 | Dotson | |
| 7,102,445 B2 | 9/2006 | Yamazaki et al. | |
| 7,142,058 B2 | 11/2006 | Bokatius | |
| 7,196,571 B2 | 3/2007 | Sumita | |
| 7,521,985 B2 | 4/2009 | Ball et al. | |
| 7,835,129 B2 | 11/2010 | Thiele | |
| 7,994,862 B1 * | 8/2011 | Pukhovski | H03F 1/30 |
| | | | 330/296 |
| 8,139,370 B2 | 3/2012 | Buer | |
| 8,183,925 B2 | 5/2012 | Ohta et al. | |
| 9,203,357 B2 | 12/2015 | Miwa et al. | |
| 9,679,885 B2 * | 6/2017 | Lidsky | H02H 3/42 |
| 10,014,886 B2 | 7/2018 | Whittaker et al. | |
| 10,056,874 B1 | 8/2018 | Ranta et al. | |
| 10,120,398 B2 | 11/2018 | Illing et al. | |
| 10,230,335 B2 | 3/2019 | Rabjohn et al. | |
| 10,247,617 B2 | 4/2019 | Ge et al. | |
| 10,454,465 B2 | 10/2019 | Tajima | |
| 11,264,954 B2 | 3/2022 | Benson | |
| 2002/0024392 A1 | 2/2002 | Maruyama et al. | |
| 2007/0030064 A1 | 2/2007 | Yu | |
| 2010/0157672 A1 | 6/2010 | Barkley | |
| 2015/0326183 A1 | 11/2015 | Chen et al. | |
| 2018/0262163 A1 | 9/2018 | Tokuda et al. | |
| 2019/0028065 A1 | 1/2019 | Mahon et al. | |
| 2019/0028066 A1 | 1/2019 | Mahon et al. | |

FOREIGN PATENT DOCUMENTS

| | | |
|---|---|---|
| EP | 1852971 A1 | 11/2007 |
| JP | H07226633 A | 8/1995 |
| JP | H08293739 A | 11/1996 |
| JP | 2005210549 A | 8/2005 |
| JP | 2013140831 A | 7/2013 |
| JP | 2015226033 A | 12/2015 |
| WO | WO 2012103633 A1 | 8/2012 |
| WO | WO 2018086666 A1 | 5/2018 |
| WO | WO 2019017779 A2 | 1/2019 |

OTHER PUBLICATIONS

Cutivet, Adrien, et al. "Characterization of dynamic self-heating in GaN HEMTs using gate resistance measurement." *IEEE Electron Device Letters* 38.2 (2016): 240-243.
Davidson, Jonathan N., et al. "Measurement and characterization technique for real-time die temoerature prediction of MOSFET-based power electronics." *IEEE Transactions on Power Electronics* 31.6 (2015): 4378-4388.
Guan, Yue. *GaN-based temperature sensing and over-temperature protection ICs*. Diss. 2011.
Kwan, Alex Man Ho, et al. "A highly linear integrated temperature sensor on a GaN smart power IC platform." *IEEE Transactions on Electron Devices* 61.8 (2014): 2970-2976.
Reiner, Richard, et al. "Linear temperature sensors in high-voltage GaN-HEMT power devices." *2016 IEEE Applied Power Electronics Conference and Exposition (APEC)*, pp. 2083-2086. IEEE, 2016.
Saadat, O. I., et al. "Schottky diode based in-situ temperature sensors for AlGaN/GaN HEMTs." *Int. Workshop Nitride Semiconductors*. 2012.
Srivastava, Puneet. "Technology Integration of GaN-on-Si HEMTs for Power Electronics Applications (Integratie van technologie van GaN-op-Si HEMTs voor vermogenselektronica toepassingen)." (2012).
Wagner, B., et al. "Thermal and Mechanical Sensors for Advancement of GaN RF MMIC Technologies." 2013.

* cited by examiner

THERMAL TEMPERATURE SENSORS FOR POWER AMPLIFIERS

FIELD OF THE DISCLOSURE

Embodiments of the invention relate to electronic systems, and more particularly, to power amplifiers.

BACKGROUND

A radio frequency (RF) communication system can include one or more power amplifiers. For example, a power amplifier can be included in a transmit path of an RF communication system to amplify signals for a suitable power level for transmission on an antenna.

Examples of RF communication systems with one or more power amplifiers include, but are not limited to, base stations, mobile devices (for instance, smartphones or handsets), laptop computers, tablets, and wearable electronics.

SUMMARY OF THE DISCLOSURE

Thermal temperatures sensors for use in power amplifiers are provided herein. In certain configurations herein, a power amplifier is fabricated using a compound semiconductor fabrication technology, such as gallium nitride (GaN) or gallium arsenide (GaAs). It can be desirable to measure the junction temperature of a power amplifier, however, compound semiconductor based power amplifier technologies may have a limited number of metal layers available for designing the layout of the power amplifier. Thus, placement of a thermal temperature sensor for measuring the junction temperature can be difficult. In certain implementations herein, a power amplifier includes an array of field-effect transistors (FETs) that amplify an RF signal, and a semiconductor resistor configured to generate a signal indicative of a temperature of the transistor array. The semiconductor resistor is located in close proximity to the transistor array (for instance, on one end of the transistor array) to serve in detecting the power amplifier's temperature while meeting design layout constraints.

In one aspect, a semiconductor die with thermal temperature sensing is provided. The semiconductor die includes a compound semiconductor substrate and a power amplifier including a plurality of field-effect transistors (FETs) configured to amplify a radio frequency (RF) signal. The plurality of FETs are arranged on the compound semiconductor substrate as a transistor array. The semiconductor die further includes a semiconductor resistor configured to generate a signal indicative of a temperature of the transistor array. The semiconductor resistor is located adjacent to one end of the transistor array.

In another aspect, a power amplifier is provided. The power amplifier includes a plurality of field-effect transistors (FETs) configured to amplify a radio frequency (RF) signal. The plurality of FETs are arranged as a transistor array. The power amplifier further includes a semiconductor resistor configured to generate a signal indicative of a temperature of the transistor array. The semiconductor resistor is located adjacent to one end of the transistor array.

In yet another aspect, a method of measuring a junction temperature of a compound semiconductor gallium nitride (GaN) power amplifier. The method includes receiving a signal from a semiconductor resistor of the power amplifier. The power amplifier includes a plurality of field-effect transistors (FETs) configured to amplify a radio frequency (RF) signal. The plurality of FETs are arranged as a transistor array, the semiconductor resistor is located adjacent to one end of a transistor array. The method further includes determining a junction temperature of the power amplifier based on the signal received from the semiconductor resistor and a look-up-table.

DETAILED DESCRIPTION OF EMBODIMENTS

Figure 1:
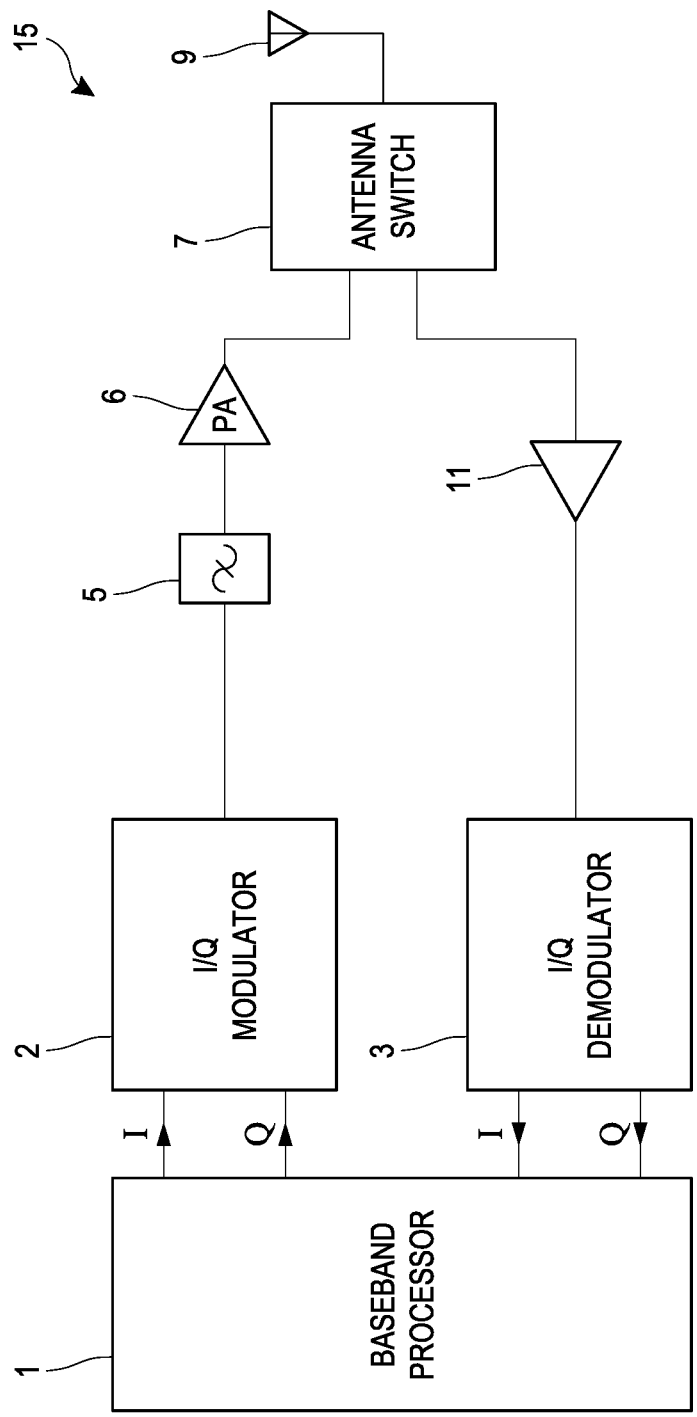
FIG. 1 is a schematic diagram of an RF communication system according to one embodiment.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system communicates by wirelessly transmitting and receiving RF signals. Such RF communication systems can include a power amplifier to amplify RF signals for transmission on an antenna. The power amplifier can provide amplification to the RF signal to provide sufficient signal strength to transmit the RF signal over far distances and/or in noisy radio environments.

A power amplifier can be manufactured using a wide variety of fabrication technologies. One type of fabrication technology is gallium nitride (GaN), which is a compound semiconductor technology. In particular, GaN is a III-V semiconductor technology suitable for high power applications. For instance, a power amplifier fabricated using a GaN process can support up to about 100 times the signal output power relative to power amplifiers fabricated using other processing technologies, such as silicon. In one example, a GaN power amplifier handles up to about 45 dBm of signal power before breakdown. Another fabrication technology suitable for power amplifiers is gallium arsenide (GaAs).

Power amplifiers serve to amplify signals to high power levels, and thus operate with high current levels and large signal voltages. Accordingly, power amplifiers can often operate at very high temperatures, however, it can be a challenge to accurately measure the operating temperature of a power amplifier.

Thus, it can be difficult to detect whether there is a problem in heat dissipation of the power amplifier. For example, in a phased array antenna system, there are often many power amplifiers associated with RF transmit channels used for beamforming. In such systems, the power amplifiers may be arranged without a sufficient thermal path for heat dissipation. Providing a temperature measurement of the power amplifier allows for the detection of potential design failures from a heat perspective, thereby enabling improvements in the design layout of the power amplifier. Moreover, temperature measurement can be used dynamically during operating of an RF communication system to disable transmissions or operate transmissions at reduced power levels in response to detecting over temperature.

However, while compound semiconductor (for instance, GaN or GaAs) based power amplifiers may have advantages for high power applications, compound semiconductor chip fabrication processes may offer a limited number of metal layers available for designing the layout of the power amplifier. For example, in some implementations, there may only be two metal layers available for a GaN or GaAs based power amplifier. This can make circuit design more challenging compared to Si circuit design. In particular, it can be difficult to locate a temperature sensor at a position where the temperature of the power amplifier can be accurately measured while maintaining the routing for the normal operation of the power amplifier.

In certain implementations, a power amplifier fabricated in a compound semiconductor technology is implemented using at least one high electron mobility transistor (HEMT). A HEMT can also be referred to as a modulation-doped field effect transistor (MODFET) or a heterojunction field effect transistor (HFET). In one embodiment, the power amplifier includes at least one pseudomorphic high electron mobility transistor (pHEMT) that operates to provide amplification to the power amplifier's input signal.

FIG. 1 is a schematic diagram of an RF communication system 15 according to one embodiment. The RF communication system 15 includes a baseband processor 1, an I/Q modulator 2, an I/Q demodulator 3, a filter 5, a power amplifier 6, an antenna switch 7, an antenna 9, and an LNA 11. Although not illustrated in FIG. 1, the power amplifier 6 is implemented with a thermal temperature sensor configured to accurately measure the peak temperature of the power amplifier 6 in accordance with the teachings herein.

Although the RF communication system 15 illustrates one example of an electronic system that can include a power amplifier including a thermal temperature sensor, power amplifiers including thermal temperature sensors can be used in a wide variety of electronic systems. Additionally, although a particular configuration of components is illustrated in FIG. 1, the RF communication system 15 can be adapted and modified in a wide variety of ways. For example, the RF communication system 15 can include more or fewer receive paths and/or transmit paths. Additionally, the RF communication system 15 can be modified to include more or fewer components and/or a different arrangement of components.

Furthermore, although FIG. 1 illustrates the amplified output signal of the LNA 11 being provided to the I/Q demodulator 3, the output signal of the LNA 11 can be provided to a wide variety of components and/or circuits, including, but not limited to, attenuators, amplifiers, filters, switches, resonators, duplexers, frequency multiplexers (for instance, diplexers or triplexers), and/or mixers.

As shown in FIG. 1, baseband processor 1 generates an in-phase (I) transmit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a sinusoidal wave or transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal are digital signals. Additionally, the baseband processor 1 can include a digital signal processor, a microprocessor, or a combination thereof used for processing the digital signals.

The I/Q modulator 2 receives the I and Q transmit signals from the baseband processor 1 and processes them to generate a modulated RF signal. In certain configurations, the I/Q modulator 2 can include digital-to-analog converters (DACs) for converting the I and Q transmit signals into an analog format, mixers for upconverting the I and Q transmit signals to radio frequency, and a signal combiner for combining the upconverted I and Q signals into the modulated RF signal.

The I/Q demodulator 3 generates the I receive signal and the Q receive signal. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to analog-to-digital converters (ADCs) used to generate the I and Q receive signals.

The filter 5 receives the modulated RF signal from the I/Q modulator 2, and provides a filtered RF signal to an input of the power amplifier 6. In certain configurations, the filter 5 can be a bandpass filter configured to provide band filtering. However, the filter 5 can be a low pass filter, a band pass filter, a notch filter, or a high pass filter, depending on the application.

The power amplifier 6 can amplify the filtered RF signal to generate an amplified RF signal, which is provided to the antenna switch 7. The antenna switch 7 is further electrically connected to the antenna 9 and to an input of the LNA 4. The antenna switch 7 can be used to selectively connect the antenna 9 to the output of the power amplifier 6 or to the input of the LNA 11.

Although FIG. 1 illustrates an example in which an output of the power amplifier 6 and an input of the LNA 11 are connected to the antenna 9 by way of the antenna switch 7, other implementations are possible. For example, the output of the power amplifier 6 and the input of the LNA 11 can be electrically connected to the antenna 9 by way of a wide variety of components, including, but not limited to, duplexers, frequency multiplexers (for instance, diplexers or triplexers), matching circuits, filters, and/or switches.

In certain implementations, the power amplifier 6 is fabricated on a compound semiconductor die or chip, such as a GaN die or GaAs die. For example, the power amplifier 6 can include one or more HEMTs fabricated using GaN or GaAs processing technology. In certain implementations, the power amplifier 6 includes at least one pseudomorphic high electron mobility transistor (pHEMT) for providing signal amplification.

Thus, the power amplifier 6 can be fabricated on a compound semiconductor die, while one or more upstream components (for instance, all or part of the I/Q modulator 2) and/or one or more downstream components (for instance, all or part of the antenna switch 7) can be fabricated on a die that is manufactured using a different processing technology, for instance, a different compound semiconductor process or a Si process such as complementary metal oxide semiconductor (CMOS) or silicon-on-insulator (SOI).

The power amplifier 6 and LNA 11 can provide amplification to signals associated with a variety of communication standards, including, for example, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Moreover, the power amplifier 6 and the LNA 11 can provide amplification to signals of a variety of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

Figure 2:
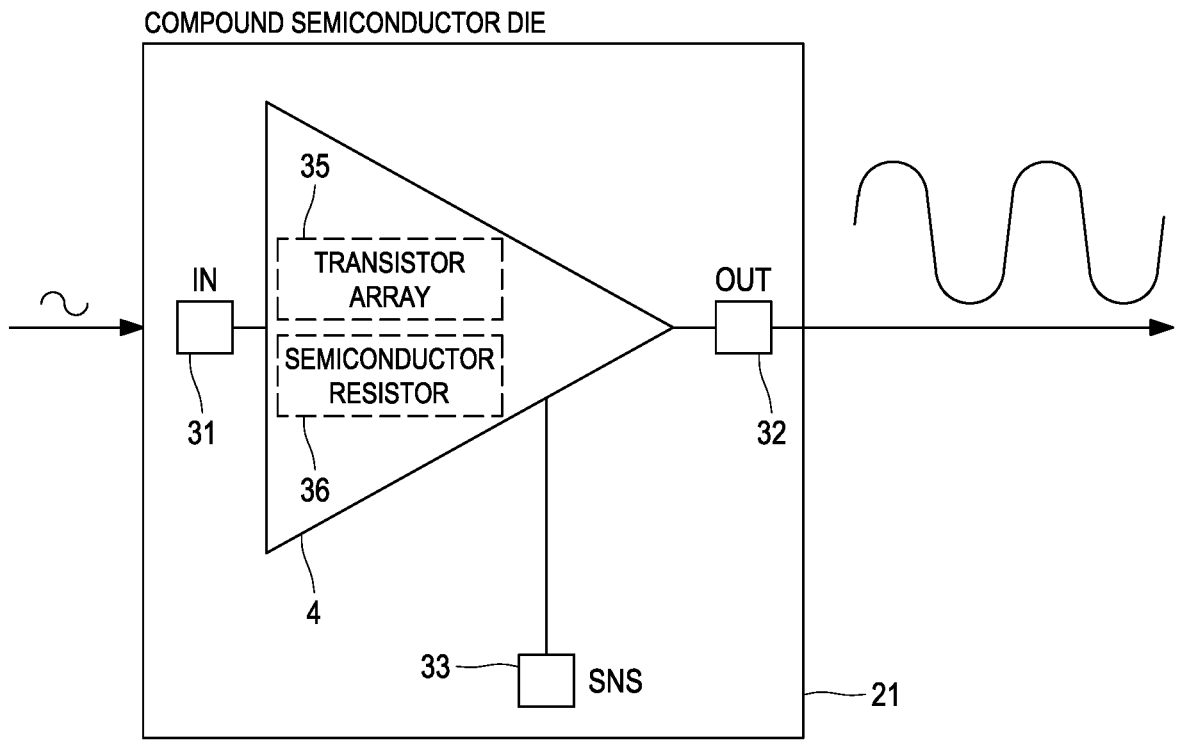
FIG. 2 is a schematic diagram of one embodiment of a compound semiconductor die for providing RF signal amplification in an RF communication system.

FIG. 2 is a schematic diagram of one embodiment of a compound semiconductor die 21 for providing RF signal amplification in an RF communication system.

As shown in FIG. 2, the compound semiconductor die 21 includes a power amplifier 6 that generates an amplified output signal which can be provided to an antenna switch (not illustrated) or other component via an electrical connection, which can be include, for example, conductors of a package, multi-chip module, and/or circuit board. In the illustrated embodiment, the power amplifier 6 includes a transistor array 35 and a semiconductor-based resistor 36 (also referred to simply as a "semiconductor resistor"). Although the compound semiconductor die 21 is illustrated as including the power amplifier 6, the compound semiconductor die 21 can include additional circuitry.

As shown in FIG. 2, the compound semiconductor die 21 includes an RF input pad or pin 31 (IN), an RF output pin 32 (OUT), and a temperature signal output pin 33 (SNS, also referred to as a temperature sensing terminal) for indicating the detected internal temperature of the power amplifier 6. Although the compound semiconductor die 21 is illustrated with three pins, the compound semiconductor die 21 can include additional pins and/or a backside conductor for connecting to ground. Furthermore, in certain implementations, the temperature signal output pin 33 can be omitted.

As shown in FIG. 2, the transistor array 35 is configured to amplify an input signal received at the RF input pin 31, and generate an output signal at the RF output pin 32.

Additionally, the semiconductor resistor 36 is configured to generate a temperature signal that is indicative of an operating temperature of the power amplifier 6. Although the FIG. 2 embodiment includes a semiconductor resistor 36 configured to generate the temperature signal, in certain implementations the thermal temperatures sensor can include additional components (for instance, diode(s), other types of resistor(s), and/or amplifier(s)) in accordance with the teachings herein.

In certain implementations, additional circuitry, such as switches, is included between the input of the power amplifier 6 and the RF input pin 31 and/or between the output of the power amplifier 6 and the RF output pin 32.

Figure 3:
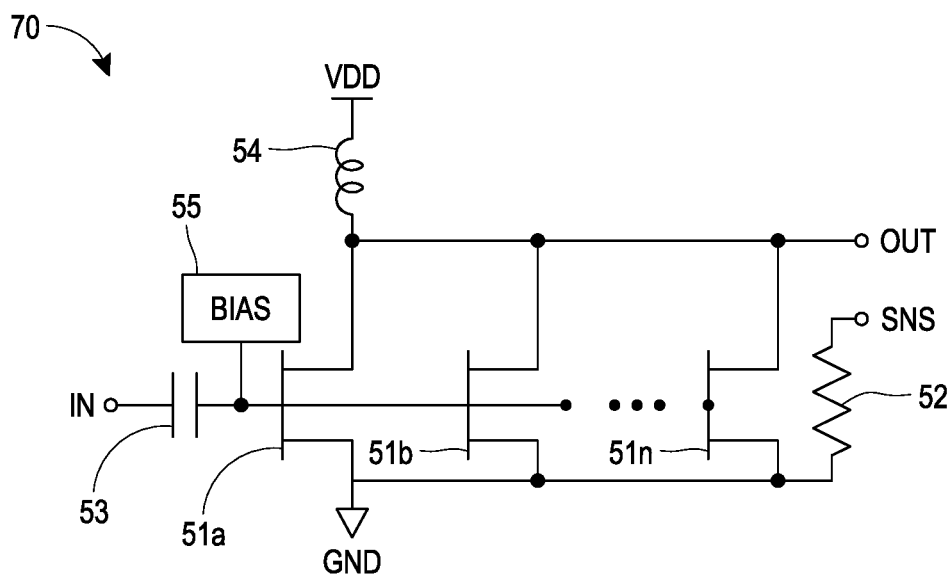
FIG. 3 is a schematic diagram of a power amplifier with a thermal temperature sensor according to one embodiment.

FIG. 3 is a schematic diagram of a power amplifier 70 with a thermal temperature sensor according to one embodiment. The power amplifier 70 includes a plurality of HEMTs 51a, 51b, . . . , 51n that are connected in parallel with one another to provide RF signal amplification. Connecting multiple transistors in parallel can aid in achieving a desired power handling capability of a power amplifier while reducing layout parasitics in comparison to an implementation with a single large transistor. The power amplifier 70 further includes a semiconductor resistor 52, an input DC blocking capacitor 53, a supply inductor 54, and a bias circuit 55. The HEMTs 51a, 51b, . . . , 51n form one or more FET banks or arrays, which together, provide amplification of an RF signal received at the power amplifier input terminal (IN), which in certain implementations corresponds to a pin or pad of a die. The power amplifier 70 can be fabricated using a wide variety of processing technologies, such as GaN or GaAs.

Although one specific implementation of the power amplifier 70 is shown, the power amplifier 70 can be modified or adapted in a wide variety of ways. In one example, the power amplifier 70 further includes degeneration, such as inductive and/or resistive denegation. In a second example, the power amplifier 70 includes one or more additional amplification stages. In a third example, the power amplifier 70 is implemented with input and/or output matching circuits for providing termination. In a fourth example, the power amplifier 70 further includes at least one cascode transistor in series with each of the plurality of HEMTs 51a, 51b, . . . , 51n. In a fifth example, the power amplifier 70 further includes an input limiter and/or an output limiter. Although various example power amplifiers have been described, the teachings herein are applicable to power amplifiers implemented in a wide variety of ways.

The HEMTs 51a, 51b, . . . , 51n operate to provide amplification to an RF signal received from the power amplifier input terminal (IN) via the input DC blocking capacitor 53. Additionally, the HEMTs 51a, 51b, . . . , 51n operate to provide an amplified RF signal to the power amplifier output terminal (OUT), which in certain implementations corresponds to a pin or pad of a die. Although an embodiment with an input DC blocking capacitor in shown, the teachings herein are also applicable to implementations without DC blocking capacitor(s) or with additional DC blocking capacitor(s), for example, connecting the outputs of the HEMTs 51a, 51b, . . . , 51n to the power amplifier output terminal (OUT). For example, certain RF communication systems can operate with externally controlled DC biasing.

As shown in FIG. 3, the supply inductor 54 provides a power supply voltage VDD to a drain of each of the HEMTs 51a, 51b, . . . , 51n. In certain implementations, the power supply voltage VDD is received from a pin or pad of a die. Additionally, a source of each of the HEMTs 51a, 51b, . . . , 51n receives a ground voltage GND (for instance, by ways of through substrate vias (TSVs) to a backside ground conductor). Furthermore, the bias circuit 55 controls a gate bias voltage of each of the HEMTs 51a, 51b, . . . , 51n. In certain implementations, the bias circuit 55 receives a bias reference signal, such as a voltage and/or current to aid in controlling the gate bias voltages of the HEMTs 51a, 51b, . . . , 51n to a suitable voltage level. Such a bias reference signal can be temperature compensated to enhance performance of the power amplifier.

With continuing reference to FIG. 3, the semiconductor resistor 52 is connected between the temperature sensing terminal SNS and the ground voltage GND, in this example. In certain implementations, the temperature sensing terminal SNS is connected to a pin or pad of a die. The semiconductor resistor 52 is integrated in a layout of the HEMTs 51a, 51b, . . . , 51n, and thus has a temperature that changes in relation to the temperature of the HEMTs 51a, 51b, . . . , 51n.

Accordingly, the semiconductor resistor 52 is suitable for detecting an internal power amplifier operating temperature, and thus can be used to detect part defects, provide insight into improving the layout design of the power amplifier, and/or to dynamically control transit power during operation to prevent a temperature fault condition (for instance, destructive overheating).

Although the power amplifier 70 is illustrated as including one embodiment of a temperature detector, the power amplifier 70 can be implemented with any of the temperature detectors described herein. For example, the power amplifier 70 can be implemented with any of the temperature detectors of FIGS. 4-11.

Figure 4:
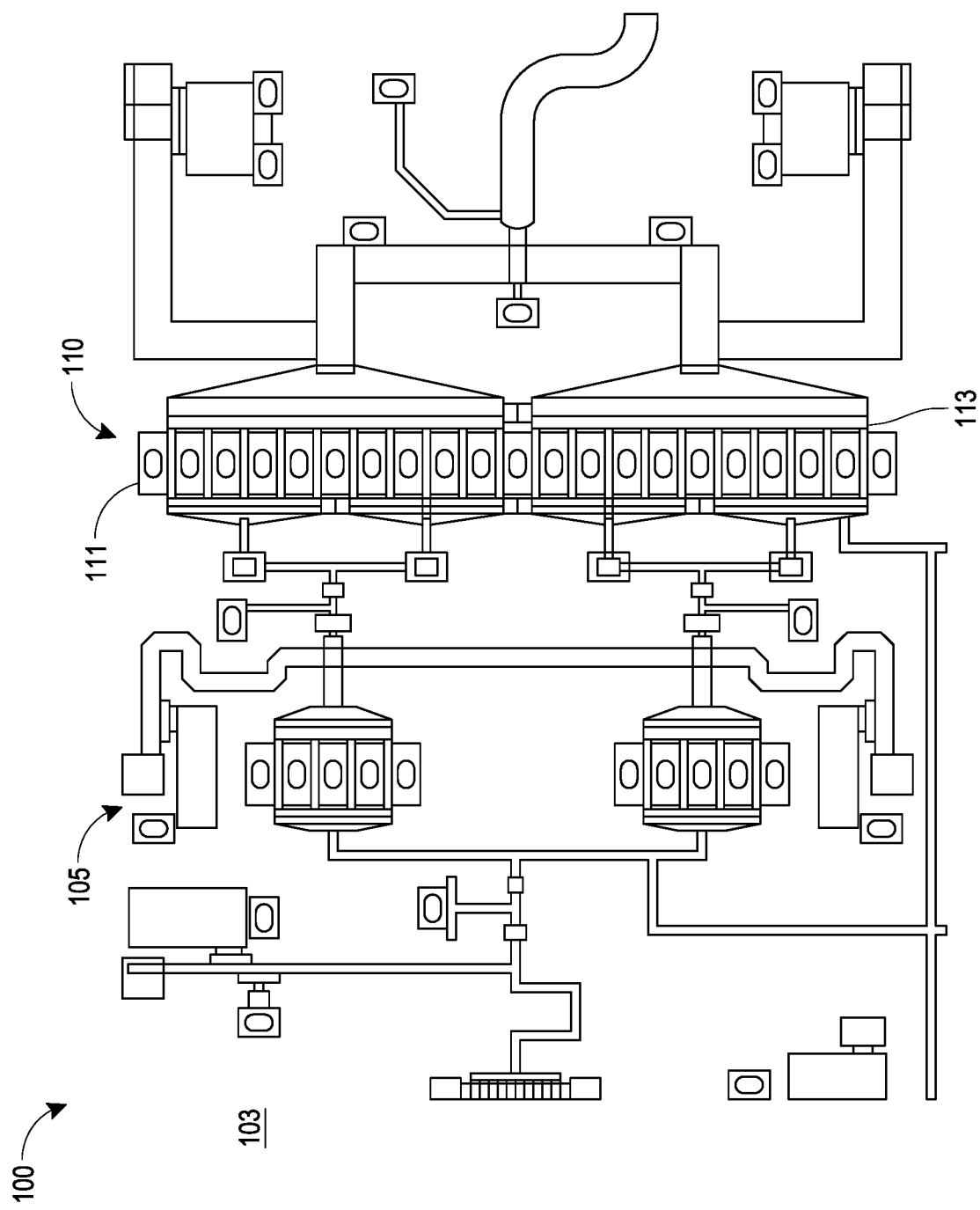
FIG. 4 is a diagram illustrating a circuit layout of a power amplifier according to one embodiment.

FIG. 4 is a diagram illustrating a circuit layout of a power amplifier 100 according to one embodiment. In the illustrated embodiment, the power amplifier 100 is fabricated on a compound semiconductor substrate 103, and includes one or more driver or input stages 105 and one or more output stage implemented as a plurality of FET banks 110. The driver stage(s) 105 receive an RF input which is provided to the FET banks 110 after initial amplification. For example, the driver stage(s) may implement an input DC blocking capacitor 53, a bias circuit 55, and/or other input conditioning elements as described in connection with FIG. 3, which condition the RF input signal for the FET banks 110. In the FIG. 4 embodiment, the FET banks 110 include a first FET bank 111 and a second FET bank 113, each formed of a plurality of HEMTs arranged in a substantially linear fashion to form an array of HEMTs.

One important design consideration for power amplifiers is the thermal heat generation and/or dissipation. In particular, a power amplifier may be designed to operate within a certain temperature band or range, and the amount of amplification that can be provided by the power amplifier can be limited when operating outside of this band.

Thus, if a given circuit layout for the power amplifier does not sufficiently dissipate the generated heat, the power generated by the power amplifier can be limited. Improper board design or thermal management can impact the transistor junction temperature (e.g., the maximum operating temperature, also referred to as the "junction temperature") by hundreds of degrees in a GaN or GaAs power amplifier. Similarly, manufacturing defects (e.g., a void or bad connection at the backside of the power amplifier wafer) can reduce heat conduction, leading to poor dissipation of heat.

Accordingly, accurate measurement of the junction temperature generated by a power amplifier can be used to improve the power amplifier design and/or diagnose manufacturing defects.

In one example application, power amplifiers may be implemented in a phased array antenna system. Such phased array antenna systems may include up to thousands of 100 W GaN power amplifiers, which may be closely spaced leading to challenges in thermal dissipation. For an example, a massive multiple-input multiple-output (MIMO) communication system can include thousands of power amplifiers for driving antenna elements of a large antenna array. It is desirable to minimize cooling techniques in the phased array design and/or other applications that benefit from a measurement of the junction temperature of one or more of the power amplifiers included therein.

Returning to FIG. 4, during operation, the majority of the heat generated in the power amplifier 110 is generated by the FET banks 110. Moreover, the heat generated by the FET banks 110 may drop off quickly in accordance with the distance from the FET banks 110. For example, heat radiates conically downward into the die's substrate, which leads to a quick fall off of heat as lateral distance from the FET bank increases. Thus, in order to accurately measure the operating junction temperature of the power amplifier 110, a thermal temperature sensor can be placed adjacent to the FET banks 110 within a threshold distance of the FET banks. For example, the threshold distance may be the thickness of the die's substrate, which may be about 100 μm in certain embodiments.

Figure 5:
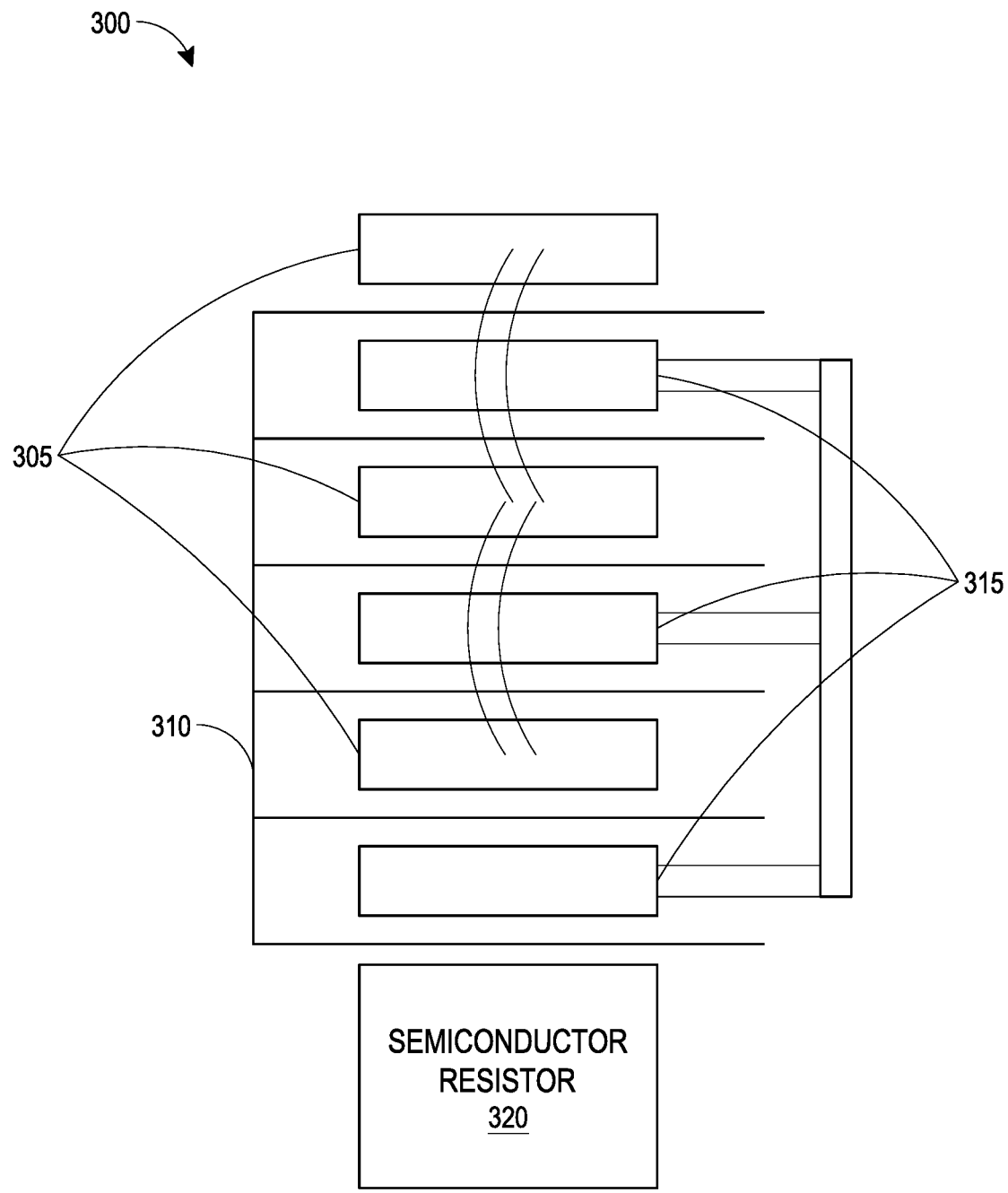
FIG. 5 is a schematic diagram of a FET bank with a semiconductor resistor according to one embodiment.

Thus, aspects of this disclosure relate to placing a thermal temperature sensor in close proximity to the FET banks. FIG. 5 is a schematic diagram of a FET bank 300 with a semiconductor resistor 320 according to one embodiment. In particular, the FET bank 300 is formed of a plurality of source terminals 305, a plurality of gate terminals 310, and a plurality of drain terminals 315. As shown in the figure, the individual FETs of the FET bank 300 can be formed in an array (e.g., arranged adjacent to each other in a linear fashion). In the embodiment of FIG. 5, the semiconductor resistor 320 can function as a thermal temperature sensor to measure the temperature of the FET bank 300. Semiconductor resistors 320 may have relatively high change in resistance (e.g., a change of about 30-50% in resistance) due to temperature in the range of operating temperatures expected for a power amplifier. Thus, semiconductor resistors 320 may be particularly suited to measuring the temperature of the FET bank 300. The semiconductor resistor 320 can be doped to a similar level as the channels of the HEMTs in the FET bank 300.

Constraints on layout resources can complicate integration or placement of the semiconductor resistor into a hot area of the power amplifier. For example, as shown in FIG. 4, a large portion of the power amplifier 100 footprint is occupied by functional components. When formed using GaN or GaAs technology, it may not be possible to place a semiconductor resistor within the FET bank 300 due to the limited number of metal layers used for routing traces for the FET bank 300. Thus, in certain embodiments the semiconductor resistor 320 can be placed adjacent to one end of the array forming the FET bank 300. Specifically, the semiconductor resistor 320 can be located in the place of an additional gate terminals 310 of the FET bank 300 in the layout such that the semiconductor resistor 320 is in close proximity to the FET bank 300 and is able to measure of the temperature of the FET bank 300. A signal generated by the semiconductor resistor 320 can be provided to a bond pad (not illustrated in FIG. 4) externally to measure the temperature of the FET bank 300. In some embodiments, a reference semiconductor resistor (e.g., see the reference resistor 40 (REF RESISTOR) illustrated in FIG. 12) can be placed in a "cold" area (e.g., an area which does not typically increase in temperature due to operation of the power amplifier) to detect the difference in temperature between the FET bank 300 and the temperature of the power amplifier in a region substantially unaffected by the heat generated by the FET bank 300.

Figure 6:
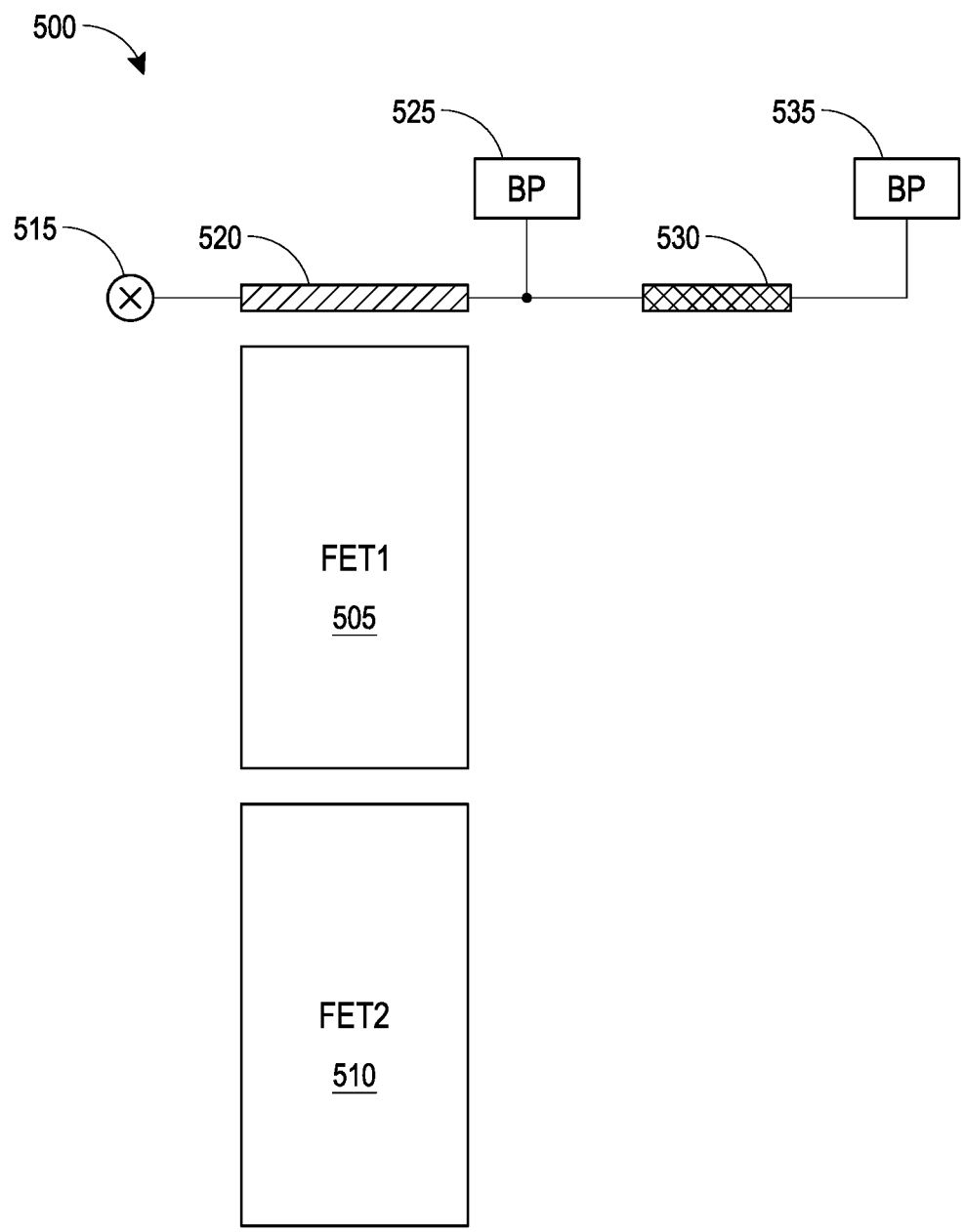
FIG. 6 is a schematic diagram of a power amplifier having a semiconductor resistor according to one embodiment.

FIG. 6 is a schematic diagram of a power amplifier 500 having a semiconductor resistor 520 according to one embodiment. In the FIG. 6 embodiment, the power amplifier includes a first transistor array FET1 505 and a second transistor array FET2 510 forming a FET bank. The power amplifier 500 further includes a voltage divider including a terminal 515, the semiconductor resistor 520, a first bond pad 525, a thin film resistor 530, and a second bond pad 535.

As shown in FIG. 6, the semiconductor resistor 520 can be placed at the edge of one of the transistor arrays FET1 505 and FET2 510. Although an example with two FET arrays is shown, a power amplifier can include more or fewer FET arrays.

Thin film resistors 530 can be fairly insensitive to temperature change, and thus, may be well suited for use in the voltage divider. For example, the temperature coefficient of the thin film resistor 530 may change by less than a few percent (e.g., less than 5%) over the normal operating temperature ranges of 25° C.-85° C. and 25° C.--40° C. That is, since the resistance of the thin film resistor 530 does not change significantly and the thin film resistor 530 is placed further away from the transistor array FET1 505 compared to the semiconductor resistor 520, the majority of the change in resistance in the voltage divider is due to the change in resistance of the semiconductor resistor 520 in response to the temperature of the transistor array FET1 505. Accordingly, the signal voltage of the bond pad 525 (corresponding to the divided voltage outputted from the voltage divider) indicates a voltage gradient versus temperature. The further away from the FET bank that the thin film resistor 530 is placed, the larger the voltage gradient vs. temperature change output from the voltage divider.

In some embodiments, the terminal 515 can be grounded (for example, the terminal 515 can correspond to a TSV connected to ground) while a supply voltage VDD can be provided to the second bond pad 535. The voltage at the first bond pad 525 can be measured and used as an indication of the temperature of the FET bank. The power amplifier can then use a look-up-table (LUT) to determine the temperature of the FET bank based on the voltage output via the first bond pad 525. In certain implementations, the LUT is located off-chip (for instance, implemented as part of another semiconductor die that monitors the temperature of the power amplifier die and/or controls a transmit power level of the power amplifier).

Although not illustrated, the power amplifier 500 may include a second voltage divider including a second reference semiconductor resistor located in a in a region substantially unaffected by the heat generated by the FET bank. The reference semiconductor resistor can be used to calibrate the semiconductor resistor 520. For example, the power amplifier 500 can compare the voltages output from the semiconductor resistor 520 and the reference semiconductor resistor with the power amplifier 500 powered off. The power amplifier can calibrate the semiconductor resistor 520 and the reference semiconductor resistor based on difference between the output voltages using a LUT.

Figure 7:
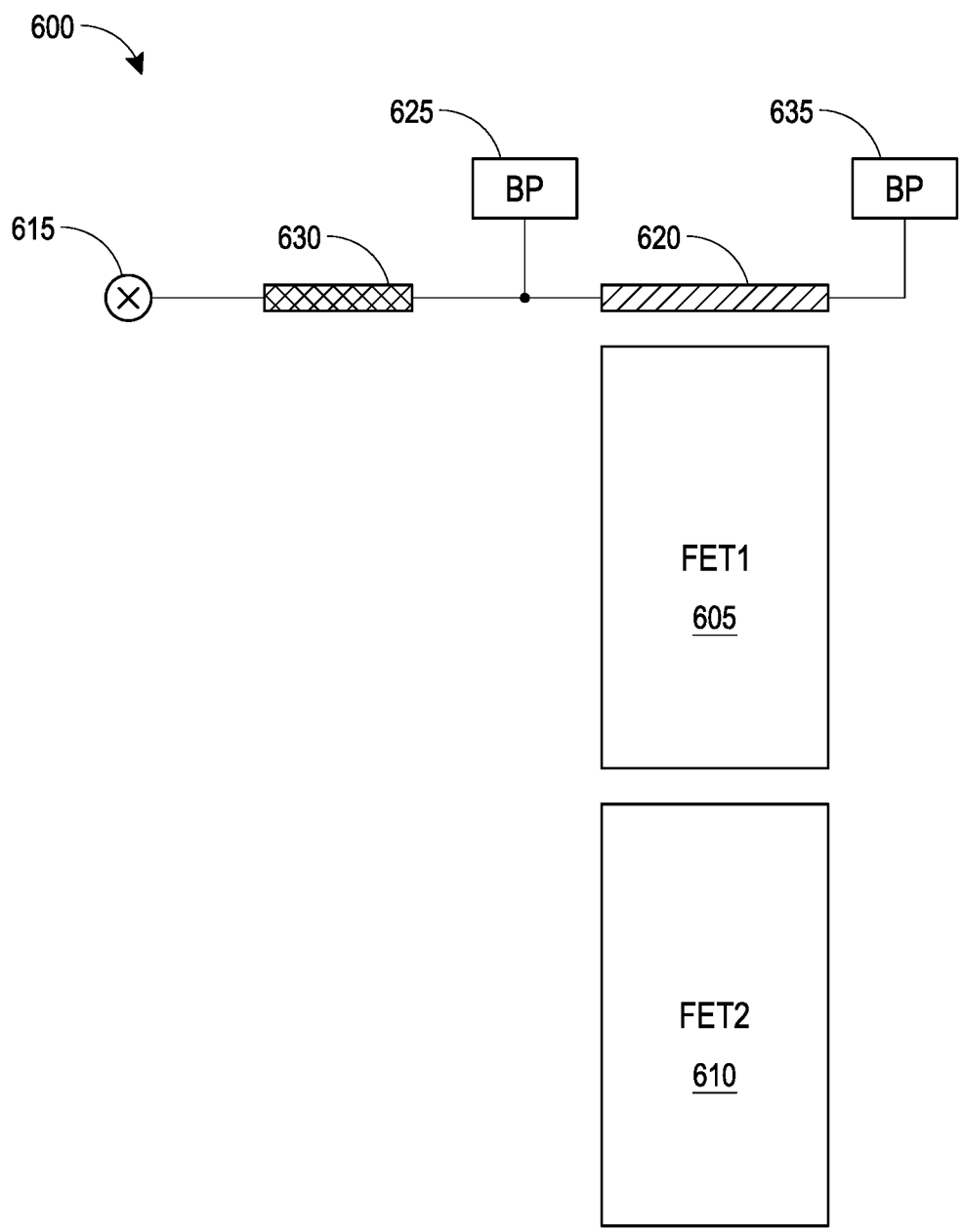
FIG. 7 is a schematic diagram of a power amplifier having a semiconductor resistor according to another embodiment.

FIG. 7 is a schematic diagram of a power amplifier 600 having a semiconductor resistor 620 according to another embodiment. The embodiment of FIG. 7 is similar to the embodiment of FIG. 6, and thus, a detailed description of similar components will not be provided. The power amplifier 600 includes a first transistor array FET1 605 and a second transistor array FET2 610 forming a FET bank as well as a voltage divider including a terminal 615, a thin film resistor 630, a first bond pad 625, a semiconductor resistor 620, and a second bond pad 635.

In contrast to the embodiment of FIG. 6, in FIG. 7 the arrangement of the semiconductor resistor 620 and the thin film resistor 530 are swapped within the voltage divider. Thus, the voltages provided by the first 625 bond pad may have an inverse relationship compared to the example of FIG. 6. The position of the semiconductor resistor 620 can also be swapped with thin film resistor 630 or other component (e.g., the diode 830 of FIG. 9 below) in the other illustrated embodiments without departing from aspects of this disclosure.

Figure 8:
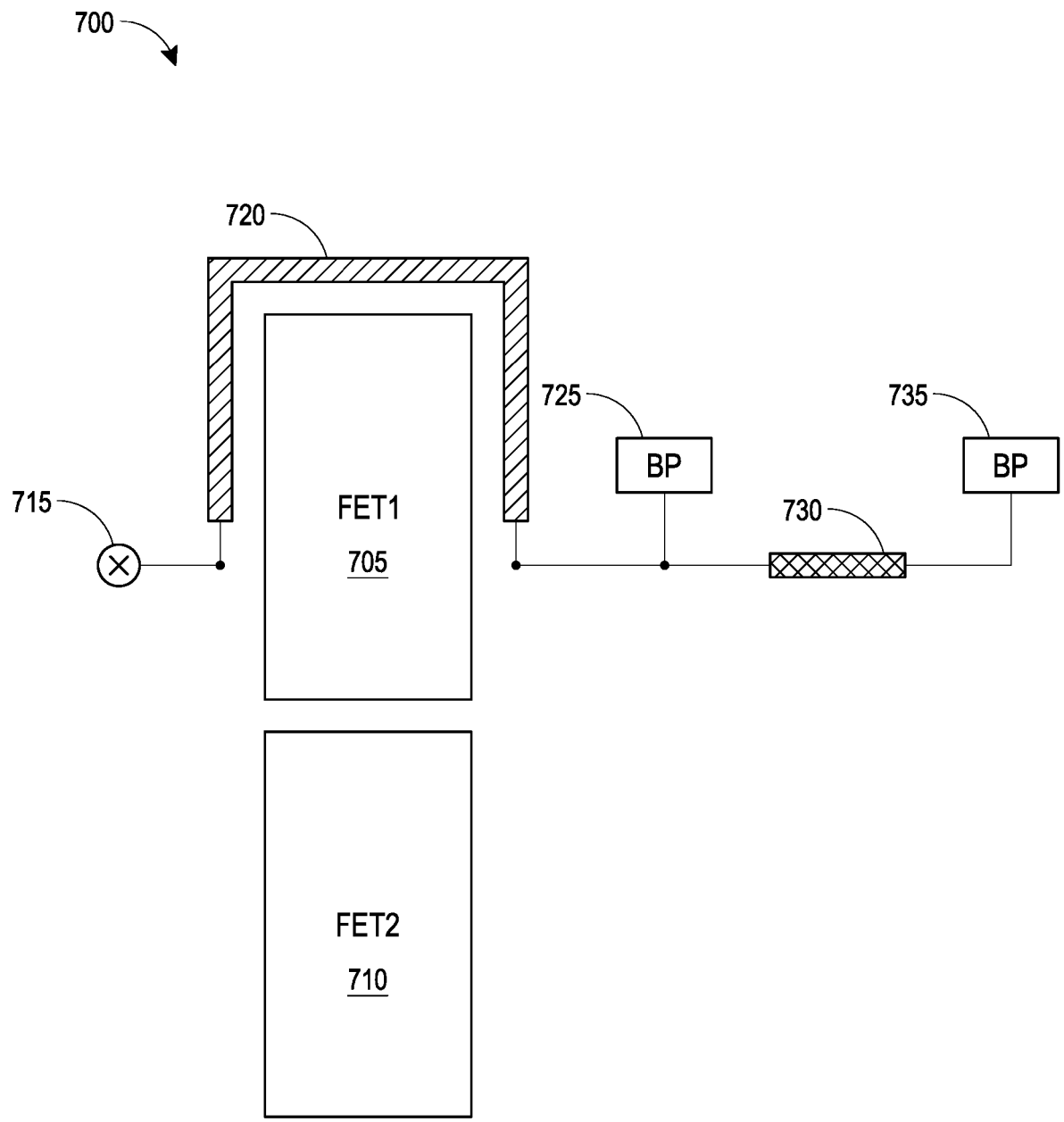
FIG. 8 is a schematic diagram of a power amplifier having a semiconductor resistor according to another embodiment.

FIG. 8 is a schematic diagram of a power amplifier 700 having a semiconductor resistor 720 according to another embodiment. The embodiment of FIG. 8 is similar to the embodiment of FIG. 6, and thus, a detailed description of similar components will not be provided. The power amplifier 700 includes a first transistor array FET1 705 and a second transistor array FET2 710 forming a FET bank as well as a voltage divider including a terminal 715, a semiconductor resistor 720, a first bond pad 725, a thin film resistor 730, and a second bond pad 735.

In the embodiment of FIG. 8, the semiconductor resistor 720 is formed to surround three sides of the transistor array FET1 705. However, the semiconductor resistor 720 can be formed adjacent to the FET bank in various different configurations. For example, the semiconductor resistor 720 can located adjacent to at least two sides of the transistor array FET1 705, or adjacent to three sides of the transistor array FET1 705 as shown in FIG. 8.

When the semiconductor resistor 720 is formed adjacent to the transistor array FET1 705 adjacent to at least two sides of the transistor array FET1 705, the semiconductor resistor 720 may be formed closer to the hottest point of the transistor array FET1 705. Thus, the semiconductor resistor 720 can more accurately measure the peak temperature of the transistor array FET1 705.

Figure 9:
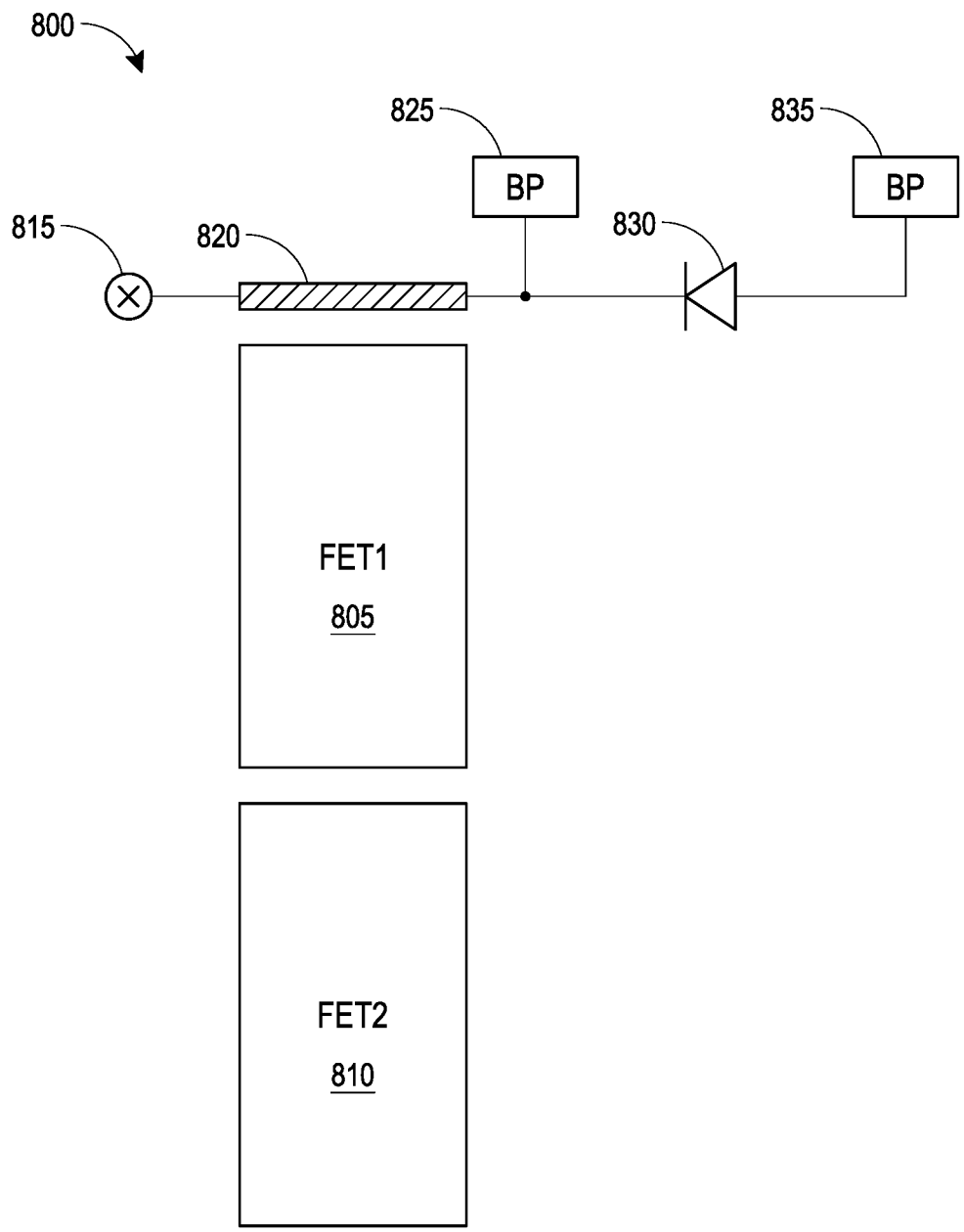
FIG. 9 is a schematic diagram of a power amplifier having a semiconductor resistor according to another embodiment.

FIG. 9 is a schematic diagram of a power amplifier 800 having a semiconductor resistor 820 according to another embodiment. The embodiment of FIG. 9 is similar to the embodiment of FIG. 6, and thus, a detailed description of similar components will not be provided. The power amplifier 800 includes a first transistor array FET1 805 and a second transistor array FET2 810 forming a FET bank as well as a voltage divider including a terminal 815, a semiconductor resistor 820, a first bond pad 825, a diode 830, and a second bond pad 835.

In the FIG. 9 embodiment, the voltage divider includes a diode 830 in place of the thin film resistor 630 of FIG. 6. Similar to the thin film resistor 630, the diode 830 may have a forward bias resistance that is relatively insensitive to temperature change (e.g., a low temperature coefficient) throughout the range of operating temperatures of the power amplifier 800 and for the voltage applied between the terminal 815 and the second bond pad 835. Thus, the voltage divider of FIG. 9 may function in a similar fashion to the voltage divider of FIG. 6 in generating a signal indicative of the junction temperature of the power amplifier 800.

Figure 10:
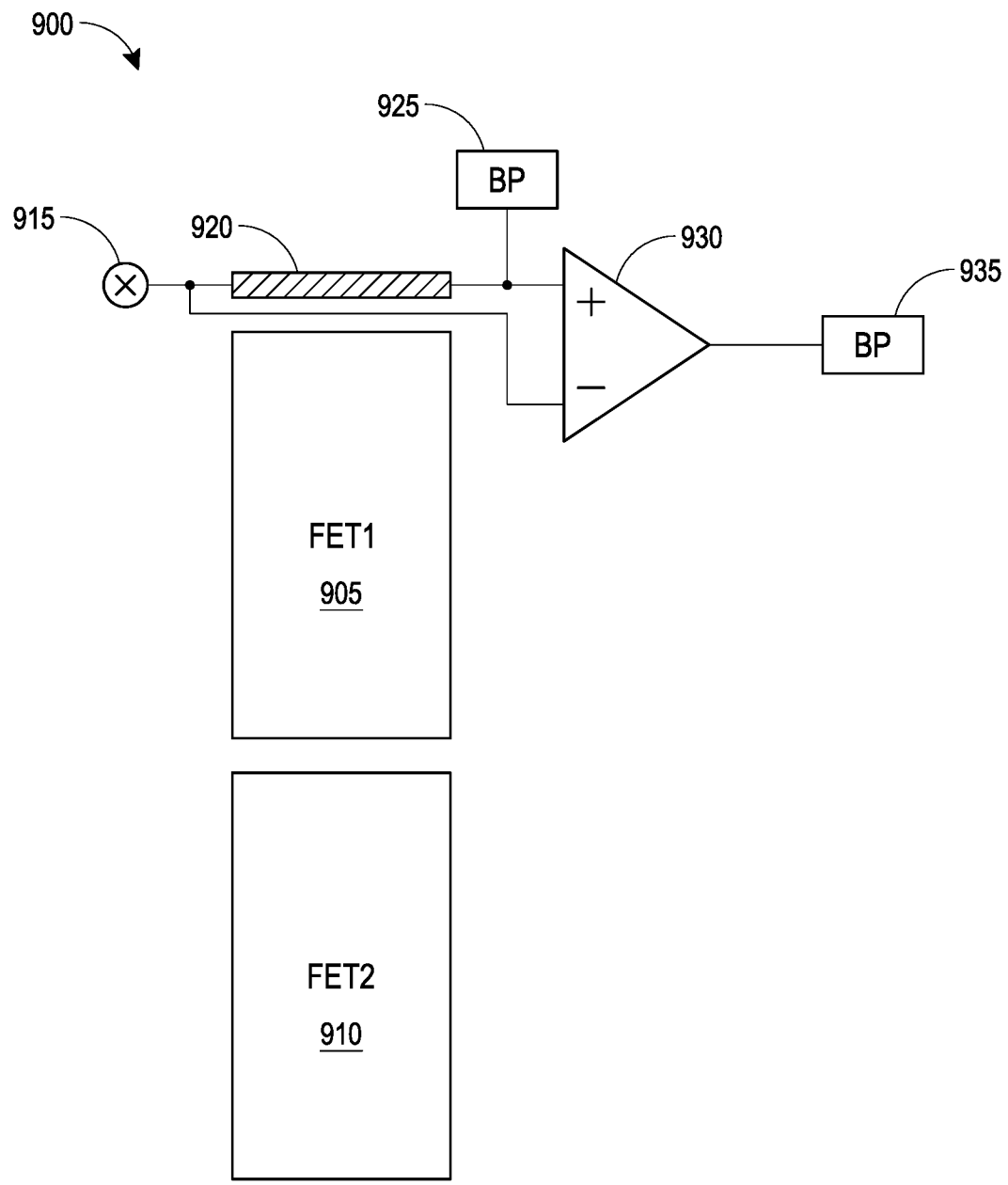
FIG. 10 is a schematic diagram of a power amplifier having a semiconductor resistor according to another embodiment.

FIG. 10 is a schematic diagram of a power amplifier 900 having a semiconductor resistor 920 according to another embodiment. The embodiment of FIG. 10 is similar to the embodiment of FIG. 6, and thus, a detailed description of similar components will not be provided. The power amplifier 900 includes a first transistor array FET1 905 and a second transistor array FET2 910 forming a FET bank as well as a temperature detection circuit including a terminal 915, a semiconductor resistor 920, a first bond pad 925, a comparator 930, and a second bond pad 935. In some embodiments, such as the FIG. 10 embodiment, an amplifier 930 can be used to amplify the voltage across the semiconductor resistor 920 to aid in detecting temperature with enhanced accuracy.

In FIG. 10, in place of a voltage divider, the power amplifier 900 includes an amplifier 930 having a non-inverting input connected to the first bond pad 925 and one end of the semiconductor resistor 920 and an inverting input connected to the grounded terminal 915. The output of the amplifier 930 is provided to the second bond pad 935 and is proportional to the resistance of the semiconductor resistor 920. In the embodiment of FIG. 10, a LUT (not illustrated) may be used to relate the voltage provided to the second bond pad 935 to the temperature of the FET bank.

Although shown as connected open-loop (for instance, connected to serve as a comparator), the amplifier 930 can also be connected closed loop in any suitable configuration for detecting the voltage across and/or current through the semiconductor resistor 930. Furthermore, although one configuration for connecting an amplifier is shown, amplifiers can be connected in a wide variety of ways to aid in providing signal detection with enhanced precision.

Figure 11:
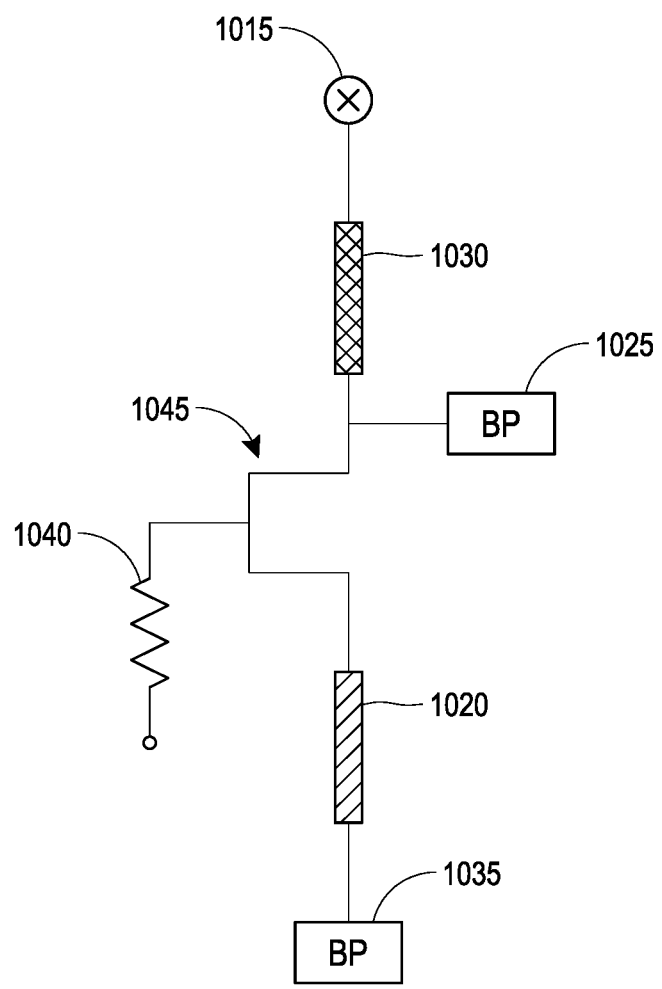
FIG. 11 is a schematic diagram of a circuit configured to amplify the signal of a thermal temperature sensor of a power amplifier according to one embodiment.

FIG. 11 is a schematic diagram of a circuit 1000 configured to amplify the signal of a thermal temperature sensor 1020 of a power amplifier according to one embodiment. Similar to the embodiments of FIGS. 6-10, the circuit 1000 includes a terminal 1015, a first bond pad 1025, a second bond pad 1035, a semiconductor resistor 1020, and a thin film resistor 1030. The circuit 1000 further includes a resistor 1040 and a transistor (for instance, a HEMT) 1045. In some embodiments, the resistor 1040 may have a low temperature coefficient (e.g., is resistant to changes in temperature) such as a thin film resistor. Although not illustrated, the semiconductor resistor 1020 can be located adjacent to one of the transistor arrays FET1 and FET2 of the FET bank such that changes in temperature of the FET bank result in a change in resistance of the semiconductor resistor 1020.

In some embodiments, such as the embodiment illustrated in FIG. 11, an amplifier can be used to amplify the voltage divider signal to more easily read the signals. The circuit 1000 is similar to the voltage divider illustrated in FIG. 6 with the addition of the transistor 1045 and resistor 1040. The transistor 1045 and resistor 1040 may function to amplify the signal read out by the first bond pad 1025 such the signal can be more easily processed. As in other embodiments, the signal received from the bond pad 1025 can be used by the power amplifier (or an external circuit) as an input to a LUT to measure the junction temperature of the power amplifier. Although one example of an amplifier that can be used to amplify the signal indicative of the junction temperature is illustrated in FIG. 11, other amplification configurations can be used to amplify the signal in accordance with aspects of this disclosure.

Figure 12:
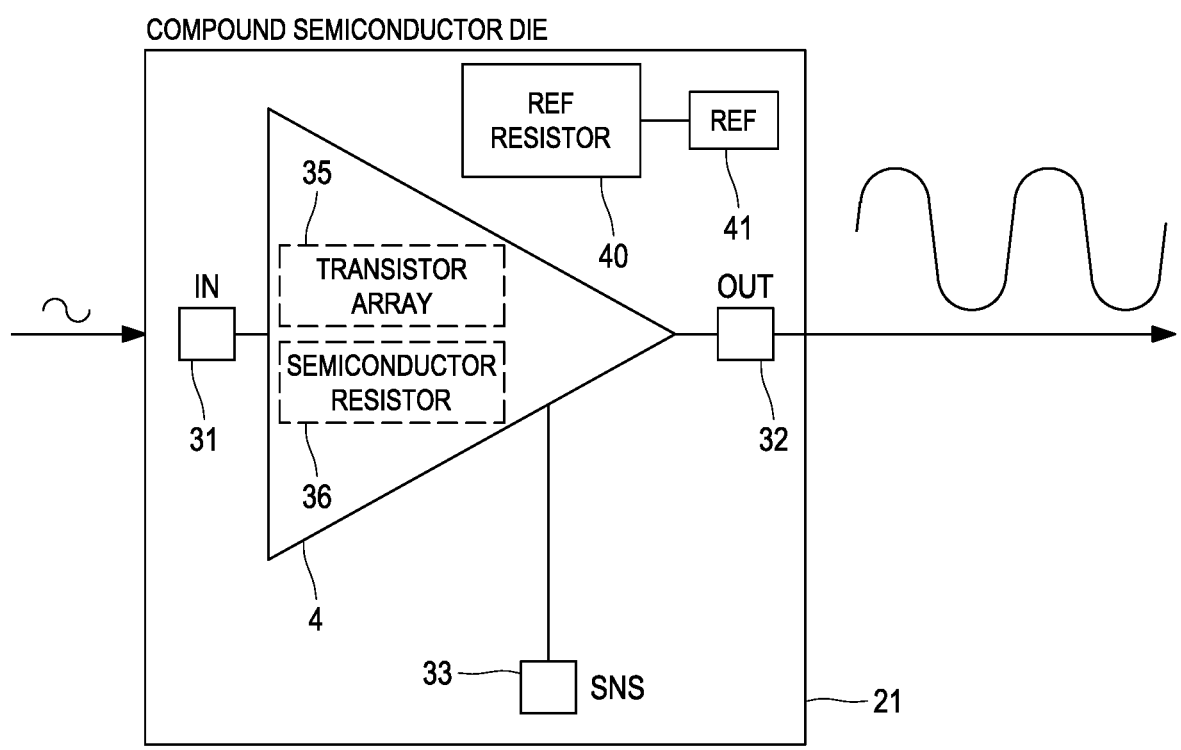
FIG. 12 is a schematic diagram of another embodiment of a compound semiconductor die for providing RF signal amplification in an RF communication system.

FIG. 12 is a schematic diagram of another embodiment of a compound semiconductor die 21 for providing RF signal amplification in an RF communication system.

As shown in FIG. 12, the compound semiconductor die 21 includes a power amplifier 6 that generates an amplified output signal which can be provided to an antenna switch (not illustrated) or other component via an electrical connection, which can be include, for example, conductors of a package, multi-chip module, and/or circuit board. In the illustrated embodiment, the power amplifier 6 includes a transistor array 35 and a semiconductor-based resistor 36 (also referred to simply as a "semiconductor resistor"). Although the compound semiconductor die 21 is illustrated as including the power amplifier 6, the compound semiconductor die 21 can include additional circuitry.

As shown in FIG. 12, the compound semiconductor die 21 includes an RF input pad or pin 31 (IN), an RF output pin 32 (OUT), and a temperature signal output pin 33 (SNS) for indicating the detected internal temperature of the power amplifier 6. Although the compound semiconductor die 21 is illustrated with three pins, the compound semiconductor die 21 can include additional pins and/or a backside conductor for connecting to ground. Furthermore, in certain implementations, the temperature signal output pin 33 can be omitted.

The compound semiconductor die may include a reference semiconductor resistor 40 located in a in a region substantially unaffected by the heat generated by the FET bank and connected to a pin 41 (REF). The reference semiconductor resistor 40 can be used to calibrate the semiconductor resistor 36. For example, the power amplifier 6 can compare the voltages output from the semiconductor resistor 36 and the reference semiconductor resistor 40 with the power amplifier 6 powered off.

Figure 13:
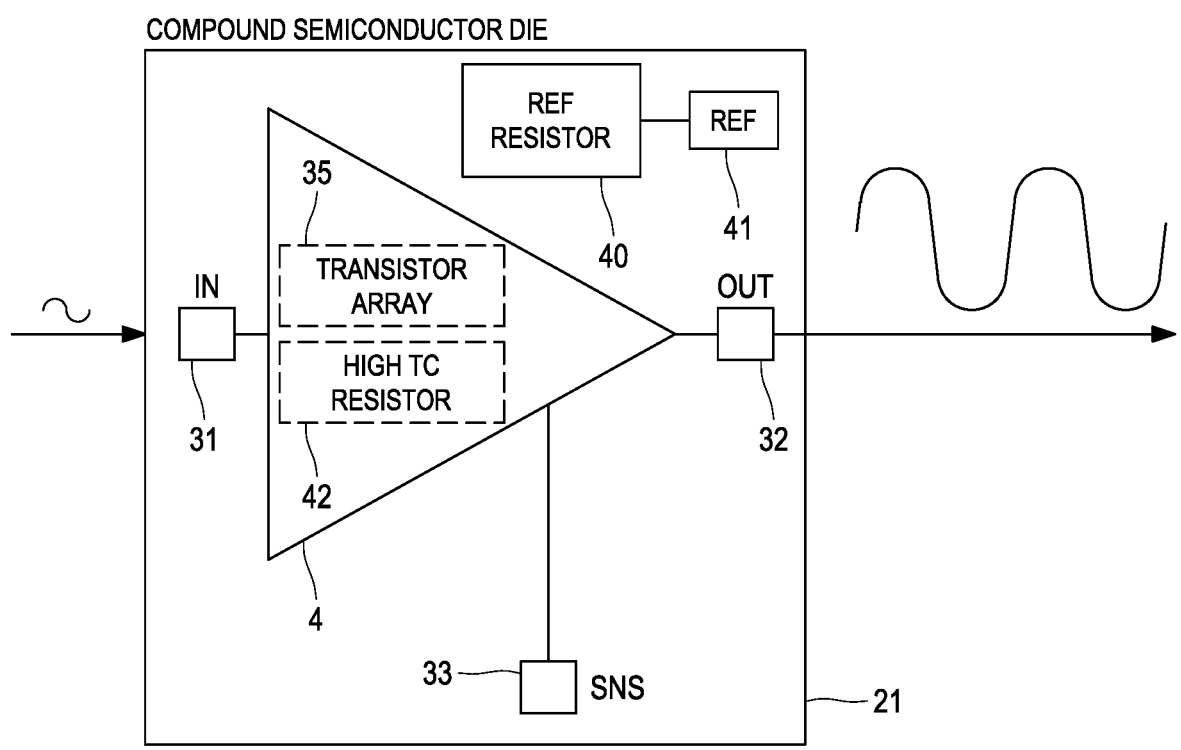
FIG. 13 is a schematic diagram of yet another embodiment of a compound semiconductor die for providing RF signal amplification in an RF communication system.

FIG. 13 is a schematic diagram of yet another embodiment of a compound semiconductor die 21 for providing RF signal amplification in an RF communication system.

As shown in FIG. 13, the compound semiconductor die 21 includes a power amplifier 6 that generates an amplified output signal which can be provided to an antenna switch (not illustrated) or other component via an electrical connection, which can be include, for example, conductors of a package, multi-chip module, and/or circuit board. In the illustrated embodiment, the power amplifier 6 includes a transistor array 35 and a high temperature coefficient (TC) resistor 42. The compound semiconductor die 21 also include other components, similar to those described above in connection with FIG. 12, which are not described in detail in connection with FIG. 13.

The high TC resistor 42 may be a resistor with a with a temperature coefficient of at least 0.25%/° C., for example, in a range of 0.25-1.166%/° C., and more particularly at least 0.666%/° C., for example, in a range of 0.666-1.166%/° C. For example, the high TC resistor 42 may be fairly sensitive to temperature change, and thus, may be well suited for use in measuring the junction temperature of the power amplifier 6.

One embodiment of a high TC resistor 42 may be a semiconductor resistor, which may have a temperature coefficient in the range of 0.25-0.666%/° C. in certain fabrication processes. For example, such semiconductor resistors can have a 15 to 40 percent change in resistance over a change of 60° C. (for instance, a rise of temperature from 25° C. to 85° C.). Another embodiment of a high TC resistor 42 may be constructed using a high TC film, which may have a temperature coefficient in a range of 0.666-1.166%/° C. For example, such high TC film resistors can have a 40 to 70 percent change in resistance over a change of 60° C. (for instance, a rise of temperature from 25° C. to 85° C.).

Any of the embodiments of FIGS. 1-12 can be implemented using a high TC resistor such as the high TC resistor of FIG. 13 without departing from aspects of this disclosure.

In the embodiment of FIG. 13, or other embodiments using a high TC resistor 42, the reference resistor 40 may be implemented as a high TC reference resistor (REF) 40. Similar to the embodiment of FIG. 12, the high TC reference resistor 40 may be located in a in a region substantially unaffected by the heat generated by the FET bank and connected to a pin 41 (REF). The high TC reference resistor 40 can be used to calibrate the high TC resistor 42.

Applications

Devices employing the above described schemes can be implemented into various electronic devices. Examples of electronic devices include, but are not limited to, RF communication systems, consumer electronic products, electronic test equipment, communication infrastructure, etc. For instance, a power amplifier can be used in a wide range of RF communication systems, including, but not limited to, base stations, mobile devices (for instance, smartphones or handsets), laptop computers, tablets, and wearable electronics. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A semiconductor die with thermal temperature sensing, the semiconductor die comprising:
    a compound semiconductor substrate;
    a power amplifier including a plurality of field-effect transistors (FETs) configured to receive a radio frequency (RF) input signal, and amplify the RF input signal to generate an RF output signal, wherein the plurality of FETs are arranged on the compound semiconductor substrate as a transistor array; and
    a high temperature coefficient (TC) resistor configured to generate a signal indicative of a temperature of the transistor array,
    wherein the high TC resistor is located adjacent to one end of the transistor array.

2. The semiconductor die of claim 1, further comprising a voltage divider including the high TC resistor and configured to output the signal indicative of the temperature as a voltage.

3. The semiconductor die of claim 2, wherein the voltage divider further comprises a thin film resistor electrically connected in series with the high TC resistor.

4. The semiconductor die of claim 2, wherein the voltage divider further comprises a transistor configured to amplify the signal indicative of the temperature.

5. The semiconductor die of claim 2, wherein the voltage divider further comprises a diode electrically connected in series with the high TC resistor.

6. The semiconductor die of claim 1, wherein the high TC resistor has a temperature coefficient of at least 0.25%/° C.

7. The semiconductor die of claim 1, wherein the high TC resistor has a temperature coefficient of at least 0.666%/° C.

8. The semiconductor die of claim 1, further comprising an amplifier configured to amplify the signal indicative of the temperature.

9. The semiconductor die of claim 1, wherein the high TC resistor is located adjacent to at least two sides of the transistor array.

10. The semiconductor die of claim 1, further comprising an amplifier having a differential input electrically connected across the high TC resistor and configured to output the signal indicative of the temperature.

11. The semiconductor die of claim 1, further comprising a reference resistor configured to generate a signal indicative of a reference temperature, the reference resistor placed in a region substantially unaffected by heat generated by the transistor array.

12. A power amplifier comprising:
    a plurality of field-effect transistors (FETs) configured to receive a radio frequency (RF) input signal, and amplify the RF input signal to generate an RF output signal, wherein the plurality of FETs are arranged as a transistor array; and
    a high temperature coefficient (TC) resistor configured to generate a signal indicative of a temperature of the transistor array;
    wherein the high TC resistor is located adjacent to one end of the transistor array.

13. The power amplifier of claim 12, further comprising a voltage divider including the high TC resistor and configured to output the signal indicative of the temperature as a voltage.

14. The power amplifier of claim 13, wherein the voltage divider further comprises a thin film resistor electrically connected in series with the high TC resistor.

15. The power amplifier of claim 13, wherein the voltage divider further comprises a transistor configured to amplify the signal indicative of the temperature.

16. The power amplifier of claim 12, wherein the high TC resistor has a temperature coefficient of at least 0.25%/° C.

17. The power amplifier of claim 12, wherein the high TC resistor has a temperature coefficient of at least 0.666%/° C.

18. The power amplifier of claim 12, further comprising a reference resistor configured to generate a signal indicative of a reference temperature, the reference resistor placed in a region substantially unaffected by heat generated by the transistor array.

19. The power amplifier of claim 18, further comprising:
    a voltage divider including the high TC resistor and configured to output the signal indicative of the temperature as a voltage.

20. The power amplifier of claim 19, wherein the voltage divider further comprises a thin film resistor electrically connected in series with the high TC resistor.

* * * * *